United States Patent
Seo et al.

(10) Patent No.: US 7,553,701 B2
(45) Date of Patent: Jun. 30, 2009

(54) SEMICONDUCTOR PACKAGING METHOD

(75) Inventors: Joon-Mo Seo, Gyeonggi-do (KR);
Byoung-Un Kang, Seoul (KR);
Jae-Hoon Kim, Seoul (KR);
Soon-Young Hyun, Gyeonggi-do (KR);
Ji-Eun Kim, Gyeonggi-do (KR);
Jun-Woo Lee, Gyeonggi-do (KR);
Ju-Hyuk Kim, Seoul (KR)

(73) Assignee: LS Mitron Ltd., Anyang (KR)

( * ) Notice: Subject to any disclaimer, the term of this patent is extended or adjusted under 35 U.S.C. 154(b) by 0 days.

(21) Appl. No.: 12/195,991

(22) Filed: Aug. 21, 2008

(65) Prior Publication Data

US 2009/0053857 A1  Feb. 26, 2009

(30) Foreign Application Priority Data

Aug. 23, 2007  (KR) .................... 10-2007-0085113

(51) Int. Cl.
*H01L 21/00* (2006.01)

(52) U.S. Cl. .................. 438/118; 438/119; 438/124; 438/126; 438/127; 257/782; 257/783; 257/784; 257/787

(58) Field of Classification Search ................. 438/118, 438/119, 124, 126, 127; 257/782, 783, 784, 257/787
See application file for complete search history.

(56) References Cited

U.S. PATENT DOCUMENTS

| | | | |
|---|---|---|---|
| 5,208,188 A * | 5/1993 | Newman | 156/310 |
| 6,621,170 B2 * | 9/2003 | Yamamoto et al. | 257/783 |
| 2002/0050585 A1 * | 5/2002 | Masayuki et al. | 252/500 |
| 2008/0241452 A1 * | 10/2008 | Kondo et al. | 428/40.1 |

* cited by examiner

*Primary Examiner*—Phuc T Dang
*Assistant Examiner*—Thanh Y Tran
(74) *Attorney, Agent, or Firm*—Jones Day

(57) ABSTRACT

The present invention relates to a semiconductor packaging method. The method comprises (S1) applying a die adhesive to an upper surface of a member through screen-printing; (S2) B-stage curing the member having the die adhesive; (S3) attaching a die on the B-stage cured die adhesive; (S4) wire-bonding the die to the member; and (S5) encapsulating the outside of the resultant, after the B-stage curing process of the step S2, a degree of cure of the die adhesive shows a decrease in heat capacity by 80 to 100%, and the step S3 is performed such that the die adhesive maintains an adhesive strength of 10 kgf/cm$^2$ or more at normal temperature after the die attaching.

4 Claims, 1 Drawing Sheet

SEMICONDUCTOR PACKAGING METHOD

TECHNICAL FIELD

The present invention relates to a semiconductor packaging method, and in particular, to a semiconductor packaging method without thermal hardening after encapsulation, in which a die adhesive satisfying predetermined conditions is used and a degree of cure of the die adhesive after a B-stage curing process is used as a control factor, so that a separate thermal hardening process after encapsulation is not required, and thus a process efficiency can be obtained.

BACKGROUND

A die paste has a wide application as an adhesive used in stacking chips or attaching a chip to a support member such as PCB or a lead-frame in a semiconductor device packaging process.

In a certain type semiconductor package, a semiconductor die or chip is mechanically connected to a substrate by an adhesive, and an electrical connection is established between the semiconductor die or chip and the substrate. The substrate is connected to another electrical device or an external power source. The semiconductor package may be manufactured by a series of steps. Alternatively, a semiconductor die or chip is mechanically connected to a substrate by an adhesive, and may be preserved for a predetermined period of time.

In the case that a semiconductor package is manufactured by a series of steps, an adhesive is applied on a substrate, a semiconductor chip is attached to the adhesive and the adhesive is cured by heat or both of heat and pressure. A solvent-free liquid or paste type adhesive or a solid type adhesive may be appropriate. The liquid or paste type adhesive is cured and solidified by heating. Meanwhile, in the case that an adhesive is applied on a substrate, a semiconductor packaging process is stopped and an assembly process is deferred to a later time, the adhesive should be solid for complete preservation. A solid type adhesive is liable to minimum or little bleeding and can accurately control the thickness of a bondline, i.e. an interface between the semiconductor chip and the adhesive, and a die tilt.

In some semiconductor package applications, a paste adhesive is preferable to a film adhesive for a procedural reason. However, the paste adhesive requires bondline and fillet control. In this case, an adhesive known as a B-stageable adhesive may be used. In the case that an adhesive material is solid, the solid is dispersed or dissolved in a solvent to form a paste, and the paste is applied on a substrate. Subsequently, the adhesive is heated to vaporize the solvent, so that a non-cured solid type adhesive leaves on the substrate. In the case that an adhesive material is liquid or paste, the adhesive is applied on a substrate, heated and partially cured into a solid state.

Such a die adhesive is applied on a member with a predetermined pattern through screen printing, passes through B-stage curing process, is left for 1 day or more at normal temperature and passes through a preliminary dry process to remove any remaining moisture before die attaching. The preliminary dry process can prevent a void that may occur to the die adhesive due to the moisture remaining in the die adhesive at a subsequent high temperature process, and thus it is indispensable to a conventional semiconductor packaging method. After a die attaching process is completed, a curing process is performed to improve heat resistance and reliability of the die adhesive. Finally, after a wire-bonding process is completed, an encapsulation process using an epoxy molding compound (EMC) is performed to protect the attached chip, and a thermal hardening indispensably process is performed to improve heat resistance and adhesion of the EMC.

As mentioned above, from application of the die adhesive to encapsulation (protection using an encapsulation material), the conventional semiconductor packaging method needs several heating processes. This goes against process efficiency and is not economical. The related industry has attempted to simplify the process, and the present invention was devised under this technical background.

SUMMARY

It is an object of the present invention to provide a semiconductor packaging method that eliminates a preliminary dry process after application of a die adhesive and a thermal hardening process after encapsulation used in a conventional semiconductor packaging method, ensures stability, reliability, heat resistance and adhesion of products, and realizes a simple process.

According to the present invention, the semiconductor packaging method comprises the following steps S1 to S5. First, a die adhesive is applied to an upper surface of a member through screen-printing (S1). B-stage curing process is performed on the member having the die adhesive (S2). A die is attached on the B-stage cured die adhesive (S3). A wire-bonding process is performed between the die and the member (S4). Finally, the outside of the resultant is encapsulated (S5). At this time, after the B-stage curing process of the step S2, a degree of cure of the die adhesive shows a decrease in heat capacity by 80 to 100%. The step S3 is performed such that an adhesive strength of the die adhesive maintains 10 kgf/cm$^2$ or more at normal temperature after the die attaching.

Preferably, in the case that the die adhesive after the step S2 is left for 1 day or more under conditions of 85° C. temperature and 85% humidity, the die adhesive has a moisture absorption rate of 0.5% or less.

Preferably, the die attaching process of the step S3 is performed such that an attached area of the die to the die adhesive is 50 to 100% based on the entire area of the applied die adhesive. Preferably, the die adhesive has a glass transition temperature (Tg) of 50 to 100° C.

BRIEF DESCRIPTION OF THE DRAWINGS

The present invention will be more fully described in the following detailed description, taken accompanying drawings, however, the description proposed herein is just a preferable example for the purpose of illustrations, not intended to limit the scope of the invention.

DETAILED DESCRIPTION

Figure 1:
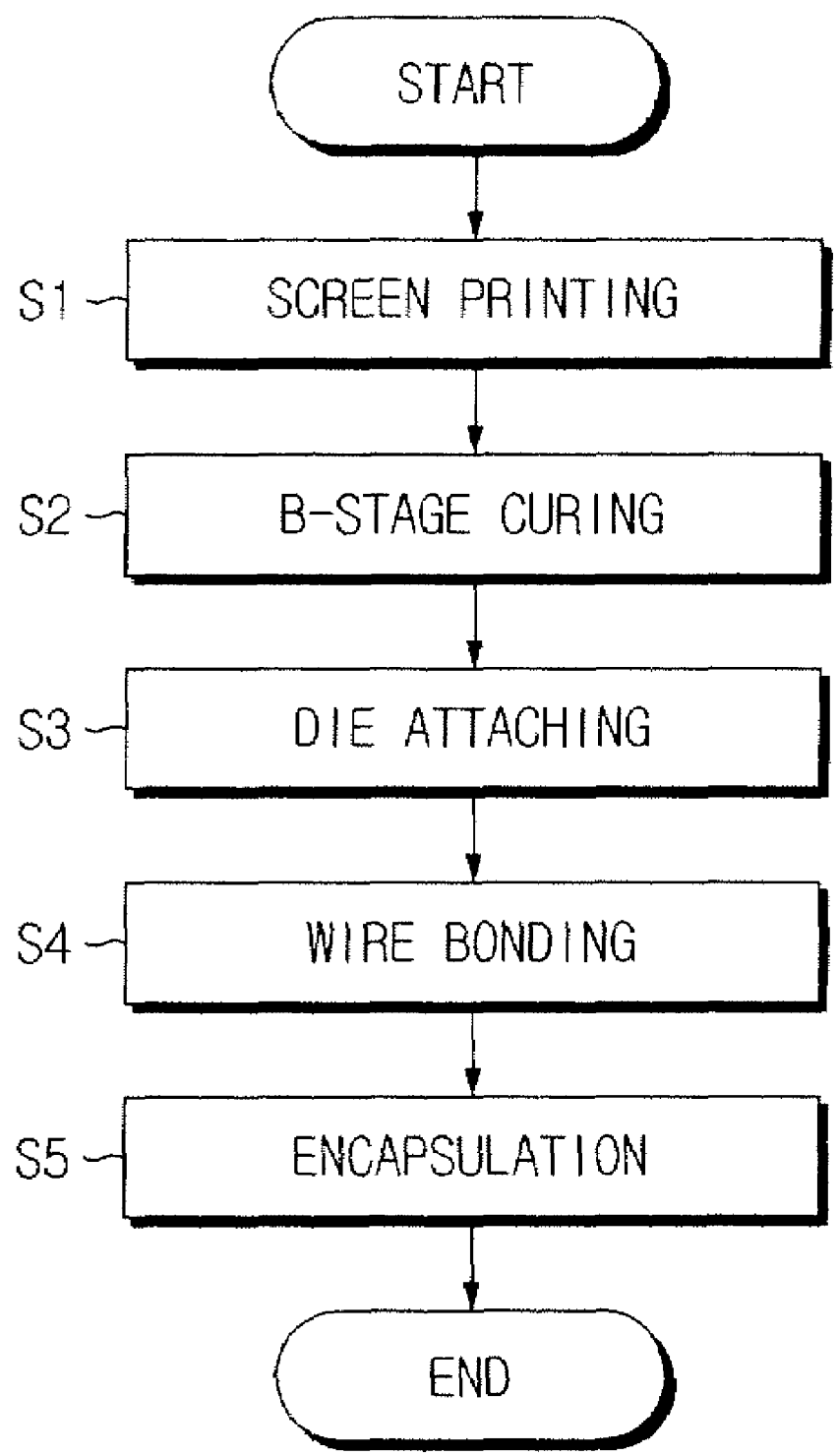
FIG. 1 is a flow chart illustrating a semiconductor packaging method according to the present invention.

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

To achieve the above-mentioned object, a semiconductor packaging method comprises the steps S1 to S5 as shown in FIG. 1.

FIG. 1 is a flow chart illustrating a semiconductor packaging method according to the present invention.

(S1) Screen-printing Step

A screen-printing process is performed on a member, for example a PCB substrate or a lead-frame to apply a die adhesive to an upper surface of the member.

(S2) B-stage Curing Step

B-stage curing process is performed on the member having the die adhesive. The B-stage curing process may be performed using heat or UV (UltraViolet) singularly or in combination sequentially or simultaneously. After the B-stage curing process, a degree of cure of the die adhesive shows a decrease in heat capacity by 80 to 100%. The degree of cure may be measured by a differential scanning calorimetry. At this time, preferable analysis conditions are that a decrease in heat capacity is investigated when the degree of cure of the die adhesive as control conditions is measured with a temperature increasing speed fixed at 10° C./min.

Preferably, in the case that the die adhesive after the step S2 is left for 1 day or more under conditions of 85° C. temperature and 85% humidity, the die adhesive has a moisture absorption rate of 0.5% or less. If the die adhesive satisfies the above-mentioned conditions, the semiconductor packaging method according to the present invention does not need preliminary process conditions that were indispensable to a conventional semiconductor packaging method, but in this context, performance of the die adhesive is not influenced.

(S3) Die Attaching Step

A die is attached on the B-stage cured die adhesive. In the step S3, the die adhesive maintains its adhesive strength at 10 kgf/cm$^2$ or more at normal temperature after die attaching. The die attaching process is performed such that an attached area of the die to the die adhesive is 50 to 100% based on the entire area of the applied die adhesive. At this time, the die adhesive has a glass transition temperature (Tg) of 50 to 100° C. If the glass transition temperature conditions of the die adhesive are satisfied, the semiconductor packaging method according to the present invention does not need a thermal hardening process of the die adhesive that was indispensable to a conventional semiconductor packaging method.

(S4) Wire-bonding Step

The attached die and the member are wire-bonded to each other.

(S5) Encapsulation Step

The outside of the wire-bonded resultant is encapsulated. For encapsulation, an encapsulation process using an epoxy molding compound (EMC) is generally used. If the above-mentioned process conditions and property conditions required for the die adhesive are satisfied, the semiconductor packaging method according to the present invention does not need a separate thermal hardening process used to improve heat resistance of an encapsulation material and the die adhesive, but can meet the required property conditions.

Hereinabove, preferred embodiments of the present invention has been described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention does not need a preliminary dry process after application of a die adhesive and a thermal hardening process after encapsulation that were indispensably performed in a conventional semiconductor packaging method, but can maintain the performance of the die adhesive, thereby providing a simple process capable of maintaining the reliability of a resultant semiconductor product.

What is claimed is:

1. A semiconductor packaging method, comprising:
(S1) applying a die adhesive to an upper surface of a member through screen-printing;
(S2) B-stage curing the member having the die adhesive;
(S3) attaching a die on the B-stage cured die adhesive;
(S4) wire-bonding the die to the member; and
(S5) encapsulating the outside of the resultant,
wherein after the B-stage curing process of the step S2, a degree of cure of the die adhesive shows a decrease in heat capacity by 80 to 100%, and
wherein the step S3 is performed such that the die adhesive maintains an adhesive strength of 10 kgf/cm$^2$ or more at normal temperature after the die attaching.

2. The semiconductor packaging method according to claim 1,
wherein in the case that the die adhesive after the step S2 is left for 1 day or more under conditions of 85° C. temperature and 85% humidity, the die adhesive has a moisture absorption rate of 0.5% or less.

3. The semiconductor packaging method according to claim 1 or 2,
wherein the die attaching process of the step S3 is performed such that an attached area of the die to the die adhesive is 50 to 100% based on the entire area of the applied die adhesive.

4. The semiconductor packaging method according to claim 1 or 2,
wherein the die adhesive has a glass transition temperature (Tg) of 50 to 100° C.

* * * * *